United States Patent
Yamada et al.

(10) Patent No.: US 8,526,825 B2
(45) Date of Patent: Sep. 3, 2013

(54) VISIBLE LIGHT COMMUNICATION TRANSMITTER AND VISIBLE LIGHT COMMUNICATION SYSTEM

(75) Inventors: Masashi Yamada, Tokyo (JP); Kousuke Nakamura, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 301 days.

(21) Appl. No.: 13/059,397

(22) PCT Filed: Sep. 25, 2009

(86) PCT No.: PCT/JP2009/067194
§ 371 (c)(1),
(2), (4) Date: Feb. 16, 2011

(87) PCT Pub. No.: WO2010/035896
PCT Pub. Date: Apr. 1, 2010

(65) Prior Publication Data
US 2011/0164884 A1  Jul. 7, 2011

(30) Foreign Application Priority Data

Sep. 26, 2008 (JP) .................................. 2008-247553
Sep. 3, 2009 (JP) .................................. 2009-204130

(51) Int. Cl.
*H04B 10/00* (2013.01)

(52) U.S. Cl.
USPC ........... 398/172; 398/128; 398/130; 398/120; 398/189; 398/135; 398/136; 398/183; 398/202; 398/208; 372/38.02; 372/29.02

(58) Field of Classification Search
USPC ................. 398/172, 128, 130, 135, 136, 182, 398/120, 183, 186, 187, 188, 189, 190, 192, 398/193, 191, 194, 198, 196, 199, 200, 201, 398/202, 208, 209, 158, 159; 372/38.02, 372/29.02
See application file for complete search history.

(56) References Cited

U.S. PATENT DOCUMENTS

| 4,486,739 A | 12/1984 | Franaszek et al. |
| 5,132,553 A | 7/1992 | Siegel |

(Continued)

FOREIGN PATENT DOCUMENTS

| JP | 4-233776 A | 8/1992 |
| JP | 6-231406 A | 8/1994 |

(Continued)

OTHER PUBLICATIONS

Korean Office Action dated Mar. 23, 2012, in a counterpart Korean patent application 10-2010-7027740.

(Continued)

*Primary Examiner* — Hanh Phan
(74) *Attorney, Agent, or Firm* — Chen Yoshimura LLP

(57) ABSTRACT

Visible light data communication with a sufficient transmission speed is performed using a general-purpose and cost-advantageous blue-light-excitation-type white LED without using a blue color filter while preventing the element from being damaged. When transmission data is inputted to a driving waveform generation unit (110) in a transmitter (100), the driving waveform generation unit (110) and a multi-gray scale driving unit (120) generate a multi-gray scale driving signal, which is supplied to the blue-light-excitation-type white LED (140) and allows the blue-light-excitation-type white LED (140) to emit light. A light signal outputted from the blue-light-excitation-type white LED (140) is collected by a lens or the like, is made incident into a PD (210) in a receiver (200), and is converted to a current signal. The current signal is converted into a voltage signal in a trans-impedance amplifier (212). Further, the light signal is subjected to equalization processing in an equalizer (214) and then is digitized by a limiting amplifier (216), thereby obtaining output data.

6 Claims, 13 Drawing Sheets

(56) References Cited

U.S. PATENT DOCUMENTS

| | | | |
|---|---|---|---|
| 5,539,588 | A | 7/1996 | Sawaguchi et al. |
| 6,496,541 | B1 | 12/2002 | Kahlman et al. |
| 7,689,132 | B2* | 3/2010 | Chen et al. ............... 398/189 |
| 2002/0167701 | A1 | 11/2002 | Hirata |
| 2006/0092099 | A1 | 5/2006 | Matsuda |
| 2007/0031157 | A1* | 2/2007 | Yamada et al. ............ 398/198 |
| 2007/0063881 | A1 | 3/2007 | Kahlman et al. |
| 2007/0171946 | A1* | 7/2007 | Hase et al. ............... 372/29.02 |
| 2008/0075160 | A1 | 3/2008 | Yamaguchi |
| 2008/0112491 | A1 | 5/2008 | Shaanan et al. |
| 2008/0131140 | A1* | 6/2008 | Shin et al. ............... 398/172 |
| 2008/0212981 | A1* | 9/2008 | Yamada et al. ............ 398/202 |
| 2010/0166436 | A1 | 7/2010 | Hase et al. |
| 2012/0230703 | A1* | 9/2012 | Yamada et al. ............ 398/172 |
| 2012/0257901 | A1* | 10/2012 | Yamada et al. ............ 398/130 |

FOREIGN PATENT DOCUMENTS

| | | | |
|---|---|---|---|
| JP | 7-183849 | A | 7/1995 |
| JP | H09-148631 | A | 6/1997 |
| JP | 2000-174711 | A | 6/2000 |
| JP | 2002-290335 | A | 10/2002 |
| JP | 2003-69507 | A | 3/2003 |
| JP | 2003-318836 | A | 11/2003 |
| JP | 3465017 | B2 | 11/2003 |
| JP | 2005-116638 | A | 4/2005 |
| JP | 2006-128393 | A | 5/2006 |
| JP | 2007-43592 | A | 2/2007 |
| JP | 3985173 | B2 | 10/2007 |
| JP | 2008-60521 | A | 3/2008 |
| JP | 2008-518545 | A | 5/2008 |
| JP | 2008-206086 | A | 9/2008 |
| JP | 2008-206087 | A | 9/2008 |
| JP | 2009-60203 | A | 3/2009 |
| JP | 2009-527892 | A | 7/2009 |
| JP | 2009-188813 | A | 8/2009 |
| WO | 2006/030911 | A1 | 3/2006 |
| WO | 2006/072935 | A1 | 7/2006 |
| WO | 2010/035896 | A1 | 4/2010 |

OTHER PUBLICATIONS

English translation of Written Opinion (PCT/ISA/237) issued in PCT/JP2009/067194 in May 2011.
European Search Report dated Jan. 18, 2013, in a counterpart European patent application No. 09816306.6.
Japanese Office Action dated Jul. 17, 2012, in a counterpart Japanese patent application No. 2009-204130.
"Applications and Future Prospect of White LED Illumination System Technology", CMC Publications, 2008.
Miyahara et al., "The Trial Manufacture of Visual Light Communication LED Driver and Evaluation of the Response Performance of Visual Light LED, Preproduction of LED driver for Visible Light Communications and Evaluation of response of visible LED", IEICE Tech. Rep., ICD2005-44, vol. 105, No. 184, 25-30p, 2005.
International Search Report (ISR) issued in PCT/JP2009/067194 (International application) mailed in Dec. 2009 for Examiner consideration.
Written Opinion (PCT/ISA/237) issued in PCT/JP2009/067194 (International application) mailed in Dec. 2009.
Japanese Office Action mailed May 14, 2013, in a counterpart Japanese patent application No. 2010-112586 (of the related U.S. Appl. No. 13/479,992).
Japanese Office Action mailed May 7, 2013, in a counterpart Japanese patent application No. 2010-068370 (of the related U.S. Appl. No. 13/528,361).
U.S. Appl. No. 13/479,992, filed May 24, 2012 and U.S. Appl. No. 13/528,361, filed Jun. 20, 2012.
International Search Report (ISR) issued in PCT/JP2011/056157 (of the related U.S. Appl. No. 13/479,992) mailed in Jun. 2011.
International Search Report (ISR) issued in PCT/JP2010/072522 (of the related U.S. Appl. No. 13/528,361) mailed in Jan. 2011.

* cited by examiner (A) EYE PATTERN DURING ERROR FREE (DRIVING CONDITION OF SETTING 4)

(B) EYE PATTERN DURING ERROR OCCURRENCE (DRIVING CONDITION OF SETTING 8)

(A) EYE PATTERN DURING ERROR FREE (DRIVING CONDITION OF SETTING 7)

(B) EYE PATTERN DURING ERROR OCCURRENCE (DRIVING CONDITION OF SETTING 13)

(A) EYE PATTERN WHEN MODULATION CODE "8B10B" IS USED (B) EYE PATTERN WHEN MODULATION CODE "17PP" IS USED (A) EYE PATTERN WHEN MODULATION CODE "8B10B" IS USED (B) EYE PATTERN WHEN MODULATION CODE "17PP" IS USED

VISIBLE LIGHT COMMUNICATION TRANSMITTER AND VISIBLE LIGHT COMMUNICATION SYSTEM

TECHNICAL FIELD

The present invention relates to a visible light communication transmitter and a visible light communication system which can transmit a signal using visible light, and more particularly, to a visible light communication transmitter and a visible light communication system, which are suitable to communications using a white light emitting diode (hereinafter referred to as a "white LED") that includes phosphor luminescence.

BACKGROUND ART

Recently, a white LED has been actively developed and spread into diverse fields, such as illumination, vehicle mounted lamps, liquid crystal backlights, and the like. This white LED, for example, has the characteristic that its on/off-switching response speed is very high in comparison to that of a white light source such as a fluorescent light or the like. Accordingly, a visible light communication system in which the illumination light of a white LED has a data transmission function using white LED light as a data transmission medium has been proposed (see Patent Document 1 below). That is, the luminescence intensity of the white LED is modulated in accordance with the transmission data, and the receiving side converts the intensity of the light into an electric signal through an optical-electrical converter (0/E converter), such as a photodiode (hereinafter referred to as a "PD") or the like, to realize data transmission.

The white LED, as described in Non Patent Document 1 below, for example, may be mainly classified into three kinds in accordance with the luminescence scheme.

(1) Blue-light-excitation-type white LED: this is obtained by combining a blue LED with a phosphor that emits mainly yellow light. That is, a phosphor that is represented by a YAG (Yttrium Aluminum Garnet) group is arranged around a blue LED, and this arrangement is accommodated in a single package. In this structure, the surrounding phosphor is excited by the blue light output from the blue LED arranged in the center, and the light (mainly yellow) that is mainly complementary to blue is output from the phosphor. A pseudo-white light is obtained by mixing the yellow fluorescence output from the phosphor and the blue light output from the blue LED.

The blue-light-excitation-type white LED has the following advantages: (1) in comparison to other types, it has high energy use efficiency, and high illumination is easily obtained, and (2) due to its simple construction, it can be inexpensively manufactured. On the other hand, the disadvantage of this white LED is that it has bad color rendering. Color rendering indicates the characteristics of color appearance of an object under illumination, and the closer its color is to that perceived under natural light, the better the color rendering.

(2) Ultraviolet-light-excitation-type white LED: This is obtained by combining an ultraviolet light with phosphors that emit three primary colors of R (Red), G (Green), and B (Blue), respectively. That is, phosphors that emit three primary colors of R, G, and B are arranged around an ultraviolet LED, respectively, and this arrangement is accommodated in a single package. In this structure, the surrounding phosphors are excited by the ultraviolet light output from the ultraviolet LED arranged in the center, and the light of three primary colors of R, G, and B is output from the phosphors, respectively. A white light is obtained by mixing the R, G, and B lights.

The ultraviolet-light-excitation-type white LED has the advantage of good color rendering. On the other hand, the disadvantages of this white LED are that (1) it has low energy use efficiency in comparison to the blue-light-excitation-type white LED and it is difficult to obtain high intensity of illumination, and (2) since it emits ultraviolet light, the driving voltage of the LED becomes high.

(3) Three-color-emitting-type white LED: this is obtained by combining LEDs of R, G, and B. That is, three kinds of LED, i.e. a red LED, a green LED, and a blue LED, are accommodated in a single package. In this structure, the white light is obtained by simultaneously making the LEDs emit the three primary colors, respectively.

The three-color-emitting-type white LED has the advantage that it has the advantages of good color rendering like the ultraviolet-light-excitation-type white LED. On the other hand, the disadvantage of the white LED is that since three kinds of LEDs are packaged in a single package, its manufacturing costs become high in comparison to other types of white LEDs.

An optical communication device using the white LED in the related art is as illustrated in FIG. 13(A). If transmission data is provided to a driving unit 902 of a transmitter 900, the corresponding driving current is output to a white LED 904, and the white LED 904 emits light in accordance with the transmission data. For example, the white LED 904 blinks on and off through modulation in a modulation method such as OOK (On-Off Keying) or the like. The light signal output from the white LED 904 is incident to a PD 912 of a receiver 910 to be converted into an electric signal, and then is converted into a voltage signal through a trans-impedance amplifier (current-voltage conversion amplifier) 914. This voltage signal is subjected to a desired equalization processing in an equalizer 916, and then is binarized by a limiting amplifier 918 to be output as reception data.

However, in the case of using the blue-light-excitation-type white LED as the white LED 904, the response speed of the light output from the phosphor is low, and thus only a transmission speed of about several Mbps at most can be obtained (see Non Patent Document 2 below). Accordingly, a method for aiming at high-speed data transmission by installing an LED color filter which filters only the color blue in front of an optical-electrical converter and removing an optical component having a low response speed, which is output from the phosphor, through this color filter has been proposed (see Patent Document 1). FIG. 13(B) illustrates the configuration of the device in this case, in which a blue color filter 922 is arranged on the light incident side of the PD 912 of the receiver 920. Using this blue color filter 922, the light emitted from the phosphor having a low response speed in the optical signal is removed. Accordingly, only the light of the blue LED is incident to the PD 912, and as a result, data transmission faster than that according to the above-described configuration can be performed. However, even using this method, only a transmission speed of about several 10 Mbps at most can be obtained.

Also, in the case of using the ultraviolet-light-excitation-type white LED as described above as the white LED 904, a transmission speed becomes about several Mbps for the same reasons as the case where the blue-light-excitation-type white LED is used. In addition, since the driving voltage of the LED is increased, it becomes difficult to configure the driving circuit. In this case, there is a method for aiming at improvement in the response speed of the light emitted from the phosphor through the improvement of the phosphor material. However, this method has problems in that it is difficult to obtain the desired intensity of illumination and the cost of the phosphor material itself is increased.

Also, in the case of using the three-color-emitting-type white LED as described above as the white LED 904, there is no phosphor luminescence component in comparison to the above-described methods, and it becomes possible to transmit data by performing wavelength multiplexing whereby the respective LEDs carry different signals to make high-speed transmission possible (see Patent Document 2 below). However, since a plurality of LEDs is used, the manufacturing costs increase.

As seen above, it is very preferable if a general-purpose and cost-advantageous blue-light-excitation-type white LED is used and high-speed transmission can be performed. As an improvement from this viewpoint, there is an "optical communication transmitter or the like" as disclosed in Patent Document 3 below. As briefly illustrated in FIG. 13C, the optical communication transmitter has the configuration in which a peaking circuit 932 is installed in a transmitter 930. Accordingly, the generation and adjustment of an optimum driving current waveform that is most suitable to perform a high-speed modulation is performed, and thereby even in a location where sunlight or light from a fluorescent light exists, an optical signal that is suitable to high-speed transmission is output from the transmitter.

CITATION LIST

Patent Literature

Patent Document 1: Japanese Patent No. 3,465,017
Patent Document 2: JP-A-2002-290335
Patent Document 3: JP-A-2007-43592

Non Patent Literature

Non Patent Document 1: "Applications and Future Prospect of White LED Illumination System Technology", CMC Publications
Non Patent Document 2: "The Trial Manufacture of Visual Light Communication LED Driver and Evaluation of the Response Performance of Visual Light LED", IEICE Tech. Rep., ICD2005-44, Vol. 105, No. 184, 25-30 p

SUMMARY OF INVENTION

Technical Problem

However, in the related art as described in Patent Document 3, since an analog peaking circuit is used, overcurrent that exceeds the rated current of the LED may flow, and this may cause the LED device to be damaged. Also, since passive components, such as resistors, capacitors, or the like, are used, it is difficult to perform adjustments for obtaining optimum driving conditions in the case where the transmission speed is high or a blue color filter is not used.

An object of the present invention is to perform visible light data communications at a sufficient transmission speed as well as preventing damage to the elements using a general-purpose and cost-advantageous blue-light-excitation-type white LED. Another object of the present invention is to perform visible light data communications at a sufficient transmission speed without using a blue color filter on the receiving side.

Solution to Problem

To solve the above mentioned problems, there is provided a visible light communication transmitter that drives a blue-light-excitation-type white LED based on a driving current signal generated based on transmission data and outputs a visible light signal to a receiver, which includes a multi-level driving means which generates a multi-level driving current signal by adding a rising pulse when the transmission data rises and adding a falling pulse when the transmission data falls. In one embodiment, the pulse width of the rising pulse and the falling pulse is ½ of the minimum pulse width of the transmission data.

According to another aspect of the present invention, there is provided a visible light communication system, which includes any of the above-described visible light communication transmitters, and a visible light communication receiver, which receives a multi-level optical signal, which is output from the visible light communication transmitter together with light output from the phosphor of a blue-light-excitation-type white LED, converts the received optical signal into an electric signal, and outputs reception data. In one embodiment, a driving current value corresponding to the transmission data is equal to or smaller than ⅓ of the current value of the rising pulse and the falling pulse.

According to still another aspect of the invention, there is provided a visible light communication system, which includes any of the above-described visible light communication transmitters, and a visible light communication receiver, which receives a multi-level optical signal that is output from the visible light communication transmitter through a filter means that removes light output from a phosphor of the blue-light-excitation-type white LED, converts the received optical signal into an electric signal, and outputs reception data. In one embodiment, a driving current value corresponding to the transmission data is equal to or smaller than ⅘ of the current value of the rising pulse and the falling pulse.

In another embodiment, a modulation encoder is installed in the visible light communication transmitter and a modulation decoder that decodes a modulation code modulated in the modulation encoder is installed in the visible light communication receiver. In still another embodiment, 8B10B is used as the modulation code. Alternatively, a run length limited code, which is DC free, for which the encoding rate is ⅔, and for which the minimum run is 1, is used as the modulation code, and NRZI modulation is performed. Other objects, features, and advantages of the invention will become more apparent from the following detailed description and the appended drawings.

Advantageous Effects of Invention

According to the present invention, since the white LED is driven by the multi-level driving current signal to which the respective pulses are added when the transmission data rises and falls, respectively, damage to the elements is prevented using the general-purpose and cost-advantageous blue-light-excitation-type white LED, and the visible light data communication at a sufficient transmission speed is performed through an easily-controllable system configuration.

BRIEF DESCRIPTION OF DRAWINGS

FIG. 5(A) shows an error free eye pattern and FIG. 5(B) shows an eye pattern during error occurrence.

FIG. 8(A) shows an error free eye pattern and FIG. 8(B) shows an eye pattern during error occurrence.

FIG. 10(A) shows an eye pattern in the case of a modulation code of 8B10B and FIG. 10(B) shows an eye pattern in the case of a modulation code of 17PP.

FIG. 12(A) shows an eye pattern in the case of a modulation code of 8B10B, and FIG. 12(B) shows an eye pattern in the case of a modulation code of 17PP.

| Reference Sign List | |
|---|---|
| 100: | transmitter |
| 110: | driving waveform generation unit |
| 112A to 112D: | multi-level waveform generation circuit |
| 114: | current mirror circuit |
| 120: | multi-level driving unit |
| 140: | Blue-light-excitation-type white LED |
| 200: | receiver |
| 210: | PD |
| 212: | trans-impedance amplifier |
| 214: | equalizer |
| 216: | limiting amplifier |
| 250: | receiver |
| 252: | color filter |
| 300: | transmitter |
| 302: | modulation encoder |
| 310: | receiver |
| 312: | modulation decoder |
| 400: | receiver |
| 900: | transmitter |
| 902: | driving unit |
| 904: | white LED |
| 910: | receiver |
| 912: | PD |
| 914: | trans-impedance amplifier |
| 916: | equalizer |
| 918: | limiting amplifier |
| 920: | receiver |

| Reference Sign List | |
|---|---|
| 922: | blue color filter |
| 930: | transmitter |
| 932: | peaking circuit |
| SA to SD: | multi-level signal pulse |

DESCRIPTION OF EMBODIMENTS

Hereinafter, best modes for carrying out the present invention will be described in detail based on embodiments.

Embodiment 1

Figure 1:
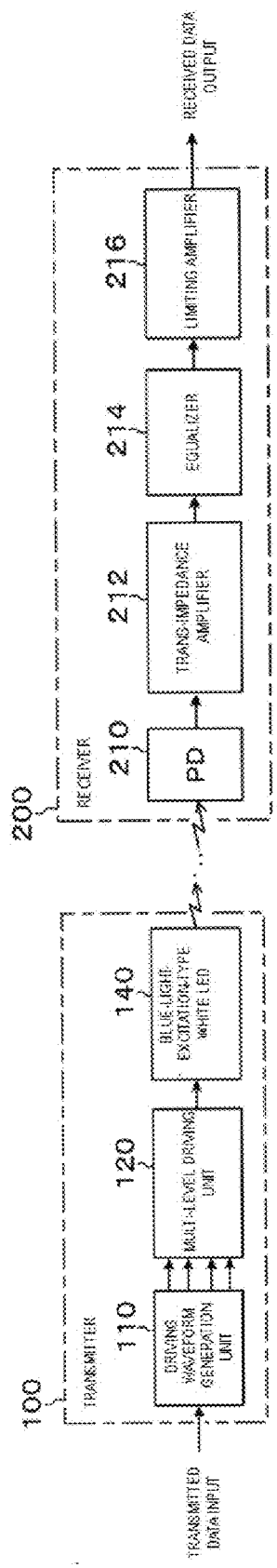
FIG. 1 is a circuit block diagram illustrating the configuration of a device according to Embodiment 1 of the invention.
Figure 2:
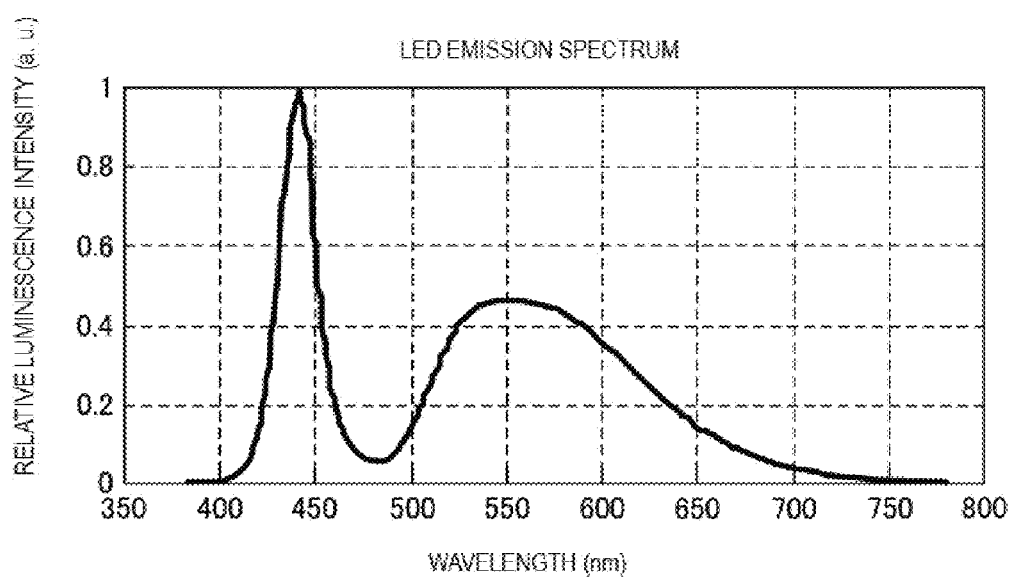
FIG. 2 is a graph illustrating an example of emission spectrum of a blue-light-excitation-type white LED according to the embodiment.

First, with reference to FIGS. 1 to 5, Embodiment 1 of the invention will be described. FIG. 1 illustrates the circuit configuration of Embodiment 1. On the transmission side in the drawing, transmission data to be transmitted is input to a driving waveform generation unit 110 of a transmitter 100. The output side of the driving waveform generation unit 110 is connected to a blue-light-excitation-type white LED 140 through a multi-level driving unit 120. In this case, as the blue-light-excitation-type white LED 140, for example, a white LED having a peak wavelength in the range of 440 to 470 nm is used. FIG. 2 illustrates an example of an emission spectrum of the blue-light-excitation-type white LED 140. In FIG. 2, the horizontal axis represents a wavelength (nm), and the vertical axis represents relative luminescence intensity (a.u.). As shown in the drawing, there is a peak in the vicinity of a wavelength of 440 nm. The low peak in the vicinity of a wavelength of 550 nm represents the luminescence component from a phosphor that ranges from green to yellow.

On the other hand, a receiving side is the same as that in the related art as described above, and an optical signal output from the transmitter 100 is incident to a PD 210 that is composed of a general-purpose Si PIN photodiode and the like. The electric signal output side of the PD 210 of the receiver 200 is connected to the input side of a limiting amplifier 216 that performs binarization through a trans-impedance amplifier 212 that converts a current signal into a voltage signal and an equalizer 214 that performs equalization. The received data is output from the output side of the limiting amplifier 216. In this embodiment, the transmission method (modulation method) is based on OOK (On-Off-Keying) of a baseband method, and the transmission speed is 50 to 125 Mbps.

Among the above-described portions, the driving waveform generation unit 110 and the multi-level driving unit 120 of the transmitter 100 are circuits for obtaining a driving current waveform as shown in FIG. 3(B) from the transmission data signal as shown in FIG. 3(A). That is, a driving current having a waveform as shown in FIG. 3(B) is obtained through synthesis of the signals as shown in FIGS. 3(C) to 3(F). More specifically, the driving waveform generation unit 110, for example, is composed of a digital circuit that includes a PLL that generates a clock synchronized with the transmission data pulse and multiplied clocks, an edge pulse detector, a one-shot multi-vibrator (not illustrated), and generates multi-level waveforms of multiple values (here, four values), illustrated in FIG. 3(C) to 3(F), based on the transmission data of FIG. 3(A). The multi-level driving unit 120 is composed of OR circuits, and synthesizes signals output from the driving waveform generation unit 110 illustrated in FIGS. 3(C) to 3(F) to output a driving current having a waveform illustrated in FIG. 3(B).

Figure 3:
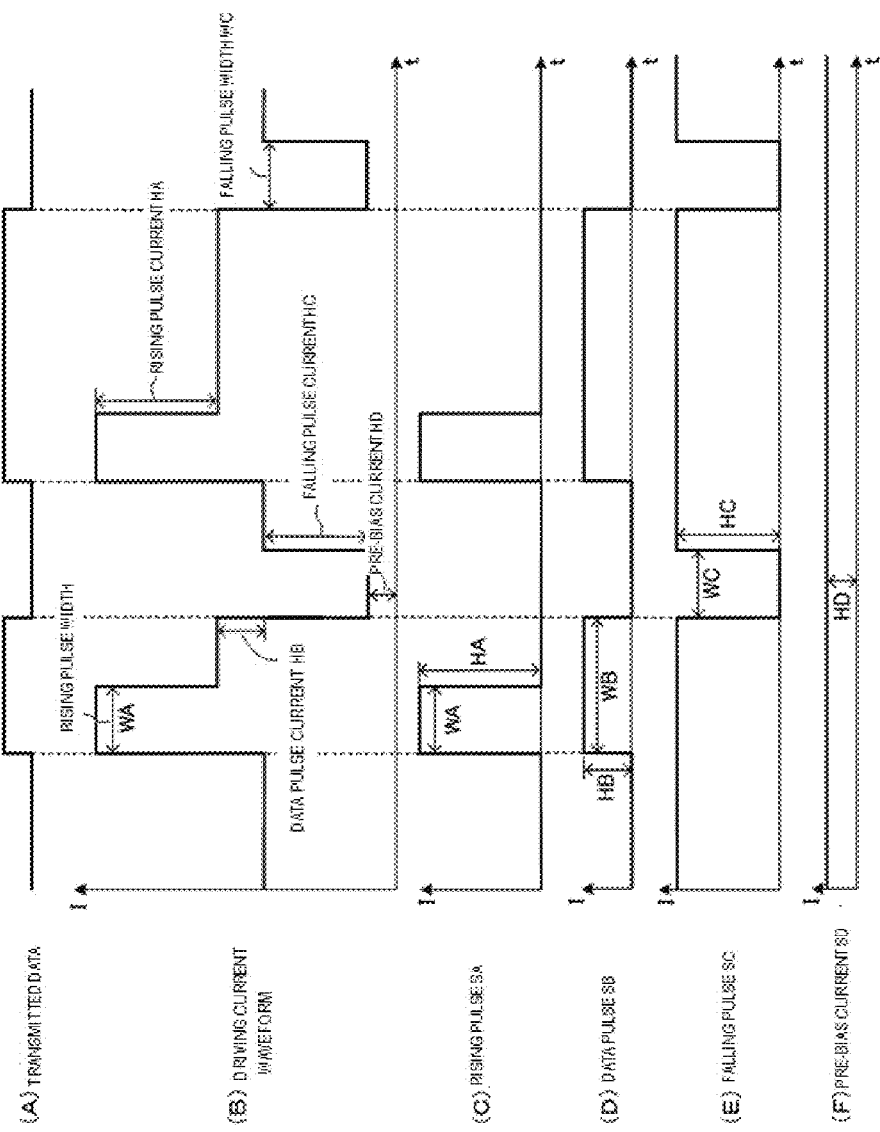
FIGS. 3(A) to 3(F) are timing charts illustrating signal waveforms on main portions according to the embodiment.
Figure 4:
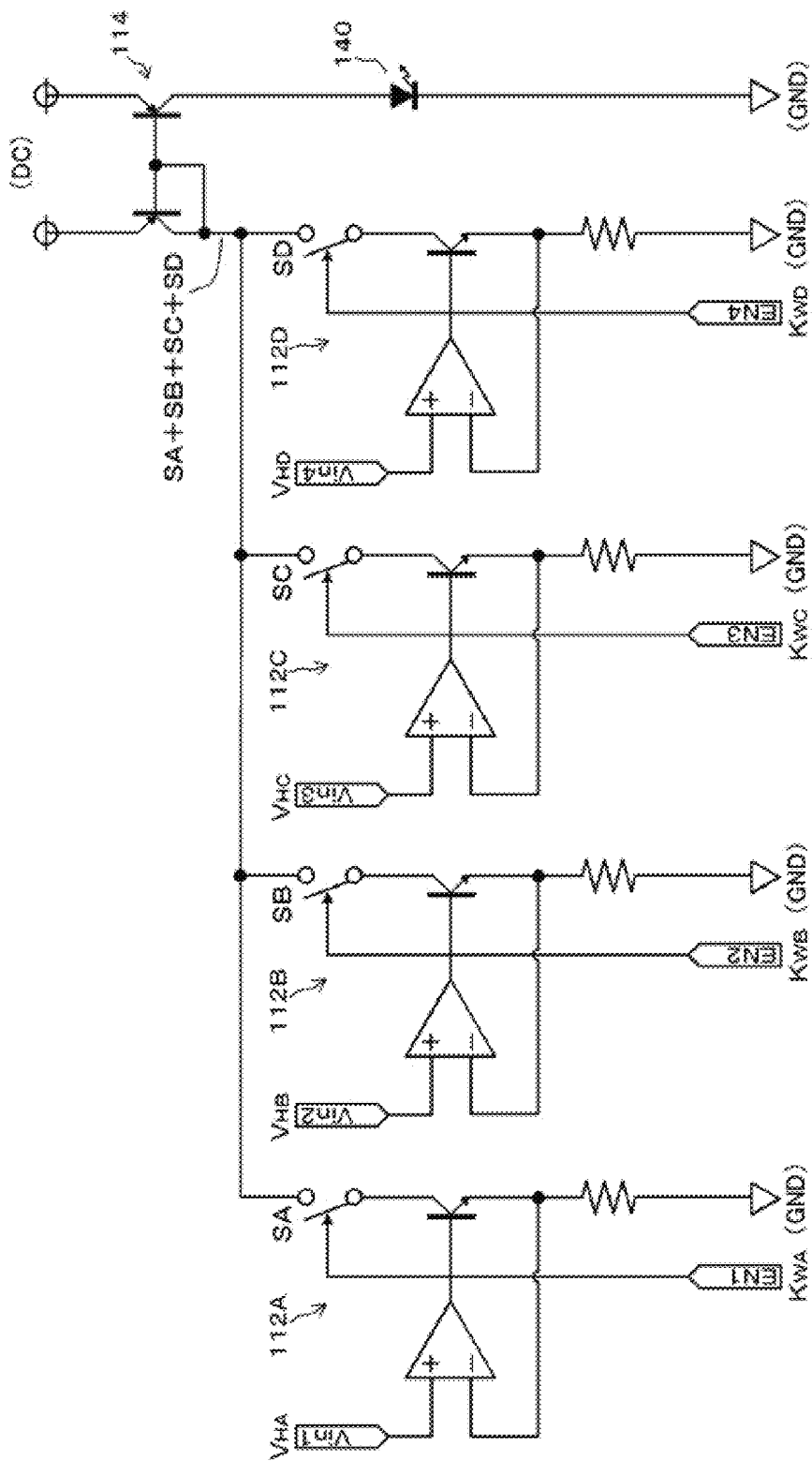
FIG. 4 is a circuit diagram illustrating an example of a circuit configuration of main portions in the embodiment.
Figure 5:
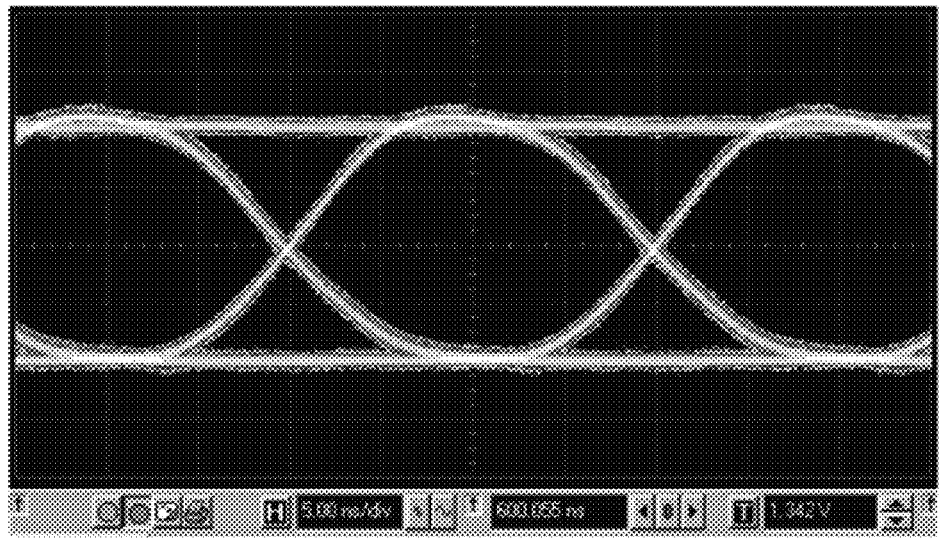
FIGS. 5(A) and 5(B) are graphs illustrating examples of an eye pattern according to the embodiment.
Figure 5:
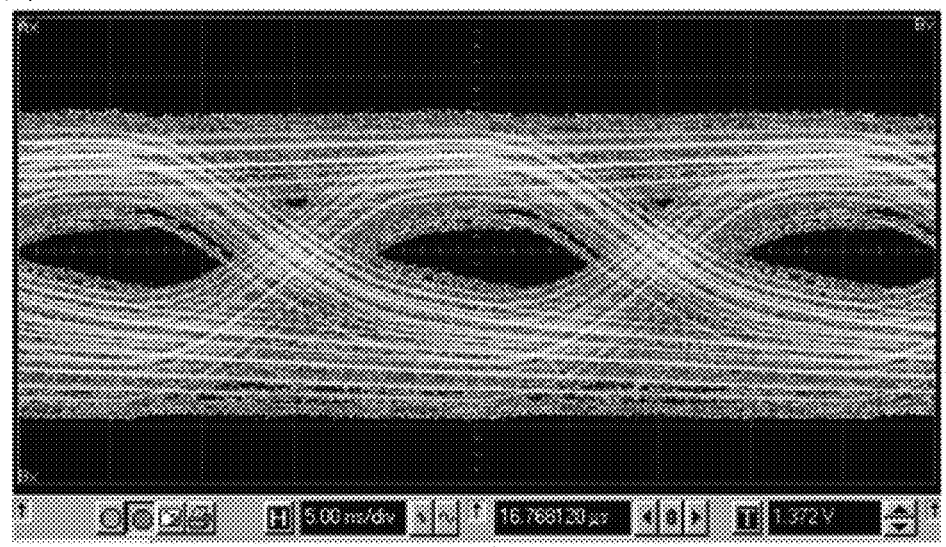

FIG. 4 is a circuit diagram illustrating an example of a circuit configuration of the main portions of the driving waveform generation unit 110 and the multi-level driving unit 120. As illustrated in the drawing, multi-level waveform generation circuits 112A to 112D include OP amplifiers, transistors, switches, and resistors, respectively, and output multi-level signals SA to SD illustrated in FIGS. 3(C) to 3(F). Pulse heights HA to HD of the multi-level signals are set by voltages VHA to VHD of pulse inputs Vin1 to Vin4 of the OP amplifiers, and the rising and falling timings are set by control signals KWA to KWD applied to control terminals EN1 to EN4 of the switches. For example, in view of the multi-level waveform generation circuit 112A, the control signal KWA rises at a rising timing of the transmission data in FIG. 3(A), and falls after a certain time, which corresponds to the pulse width WA, elapses. Accordingly, the switch is turned on at that time period, and the voltage VHA is output as the multi-level signal SA. Other multi-level waveform generation circuits 112B to 112D operate in the same manner, and output the multi-level signals SB to SD, respectively.

At this time, the control signals KWA to KWD may be considered as 4-bit digital signals which are determined from the logic values of the transmission data. For example, the control signals "KWA, KWB, KWC, KWD" become "1, 1, 1, 1" at a timing (rising timing) when the logic value of the transmission data changes from "L" to "H", become "0, 1, 1, 1" when the time, which corresponds to the pulse width WA of the multi-level signal SA, elapses after the rising timing, become "0, 0, 0, 1" at a timing (falling timing) when the logic value of the transmission data changes from "H" to "L", and become "0, 0, 1, 1" when the time, which corresponds to the pulse width WC of the multi-level signal SC, elapses after the falling timing.

The multi-level signals SA to SD output from the multi-level waveform generation circuits 112A to 112D are added by a wired OR circuit, and then supplied to the blue-light-excitation-type white LED 140 through a current mirror circuit 114.

Next, the multi-level signal pulses SA to SD illustrated in FIGS. 3(A) to 3(F) will be described. First, the pulse width WA of the rising pulse SA, which is generated when the transmission data rises, is ½ of the minimum pulse width of the transmission data at the rising timing of the transmission data. In the same manner, the pulse width WC of the multi-level signal SC, which is generated when the transmission data falls, is ½ of the minimum pulse width of the transmission data at the falling timing of the transmission data. The pulse width WB of the data pulse SB is equal to the pulse width of the transmission data. The current value HD of the pre-bias current SD is constant regardless of the transmission data.

On the other hand, as for the pulse height (current level), the total sum of the respective pulses HA+HB+HC+HD is restricted by the condition of rated current value of the LED of the object to be driven or the upper limit of the driving current value of the driving circuit. In this embodiment, in the case of realizing a transmission speed of equal to or higher than 50 Mbps, the height of the data pulse SB is set to be equal to or lower than ⅓ of the height HA of the rising pulse SA and the height HC of the falling pulse SC. By setting this, the interference between codes is suppressed, and thus the bit error rate can be lowered.

The multi-level driving unit 120 is a circuit in which current can be driven in an ns order, and can output a bias voltage that is higher than the forward bias voltage (about 3.6V) that is necessary to drive the blue-light-excitation-type white LED 140.

As the blue-light-excitation-type white LED 140, for example, a general-purpose white LED having a rated current of 500 mA (when the pulse is driven) may be used. The white LED is driven under a setting condition of the driving current shown in Table 1 below. For example, under the condition of "setting 2", the following values are set.

(1) Current value HA of a rising pulse SA: 75.9 mA
(2) Current value HB of a data pulse SB: 6.3 mA
(3) Current value HC of a falling pulse SC: 76.5 mA
(4) Pre-bias current value HD: 5.2 mA

TABLE 1

| | Setting Values of Driving Current | | | | | | | |
|---|---|---|---|---|---|---|---|---|
| | Setting 1 | Setting 2 | Setting 3 | Setting 4 | Setting 5 | Setting 6 | Setting 7 | Setting 8 |
| Rising Pulse Current Value HA | 80.6 | 75.9 | 83.2 | 92.8 | 94.9 | 86.1 | 84.3 | 73.6 |
| Data Pulse Current Value HB | 0 | 6.3 | 8.0 | 12.7 | 17.9 | 19.4 | 23.9 | 29.6 |
| Falling Pulse Current Value HC | 84.9 | 76.5 | 78.3 | 86.7 | 92.3 | 76.9 | 68.4 | 65.3 |
| Pre-bias Current Value HD | | | | | 5.2 | | | |
| The Ratio Rab of HB to HA | 0 | 0.08 | 0.10 | 0.14 | 0.19 | 0.23 | 0.28 | 0.40 |
| The Ratio Rcb of HB to HC | 0 | 0.08 | 0.10 | 0.15 | 0.19 | 0.25 | 0.35 | 0.45 |

Unit of current values is all [mA]

Next, the operation of this embodiment configured as above will be described. The driving waveform generation unit 110 of the transmitter 100, for example, receives input of the transmission data as illustrated in FIG. 3(A). Then, the driving waveform generation unit 110 and the multi-level driving unit 120 generate a multi-level driving signal illustrated in FIG. 3(B) and provide it to the blue-light-excitation-type white LED 140, so that the white LED 140 emits light. The optical signal output from the blue-light-excitation-type white LED 140 is collected by a lens (not illustrated) or the like, and is incident on the PD 210 of the receiver 200. The received optical signal is converted into a current signal through the PD 210, and then is converted into a voltage signal through the trans-impedance amplifier 212. The signal converted into the voltage is subjected to desired equalization through the equalizer 214, and then is binarized by the limiting amplifier 216 to obtain output data. This embodiment of the invention uses a receiver in which the reception band of the modulated light of the receiver is sufficient for the transmission signal, and the frequency characteristics in the band necessary for the reception are flat.

The experiments on data transmission and reception performed using a prototype visible light communication system of this embodiment will be described. The four data transmission speeds were 50 Mbps, 75 Mbps, 100 Mbps, and 125 Mbps, the results of measuring the bit error rate on respective driving setting conditions as shown in Table 1 above are shown in Table 2 below. The transmission data were the pseudorandom pattern (PRBS) 27-1, and the number of transmission data was 1011 bits.

TABLE 2

Bit Error Rate

| Transmission Speed | Setting 1 | Setting 2 | Setting 3 | Setting 4 | Setting 5 | Setting 6 | Setting 7 | Setting 8 |
|---|---|---|---|---|---|---|---|---|
| 50 Mbps | $7.0 \times 10^{-11}$ | 0 | 0 | 0 | 0 | 0 | 0 | $3.0 \times 10^{-3}$ |
| 75 Mbps | $4.0 \times 10^{-11}$ | 0 | 0 | 0 | 0 | $1.0 \times 10^{-2}$ | NoSync | NoSync |
| 100 Mbps | $2.7 \times 10^{-9}$ | 0 | 0 | $1.1 \times 10^{-6}$ | NoSync | NoSync | NoSync | NoSync |
| 125 Mbps | $4.2 \times 10^{-3}$ | 0 | 0 | $4.3 \times 10^{-2}$ | NoSync | NoSync | NoSync | NoSync |

"NoSync" indicates a non-synchronous state.

For example, in Table 2, when the uppermost transmission speed was set to 50 Mbps, there was no error or error rate value was sufficiently low for the conditions "Setting 1" through "Setting 7", and thus data can be transmitted with no practical problem. For the conditions of "Setting 1" to "Setting 6", as shown in Table 1, the ratio Rab (HB/HA) of a data pulse current value HB to a rising pulse current value HA, and the ratio Rcb (HB/HC) of the data pulse current value HB to a falling pulse current value HC are all equal to or smaller than ⅓. Also, for the condition of "Setting 7", the ratio Rab of the data pulse current value HB to the rising pulse current value HA, and the ratio Rcb of the data pulse current value HB to the falling pulse current value HC were set to 0.28 and 0.35, respectively. From this viewpoint, if the ratio Rab of the data pulse current value HB to the rising pulse current value HA, and the ratio Rcb of the data pulse current value HB to the falling pulse current value HC are at least equal to or smaller than ⅓, the data transmission of 50 Mbps can be favorably performed.

Further, the results of Table 2 show that even when performing data transmission with a transmission speed equal to or higher than 75 Mbps, the driving current setting value, in which there is no error, or the error rate value becomes sufficiently small is such that the ratio Rab of the data pulse current value HB to the rising pulse current value HA, and the ratio Rcb of the data pulse current value HB to the falling pulse current value HC are equal to or smaller than ⅓.

Next, under the driving conditions of "Setting 4" and "Setting 8" of Table 2, an eye pattern during data transmission at 50 Mbps was measured. The result is shown in FIGS. 5(A) and 5(B). FIG. 5(A) shows an eye pattern under the driving condition of "Setting 4" that corresponds to error free, and FIG. 5(B) shows an eye pattern under the driving condition of "Setting 8" that corresponds to error occurrence. As shown in the drawings, in the case of the error free condition as shown in FIG. 5(A), a good eye pattern is obtained. However, in the case where the bit error rate deteriorates to $3.0 \times 10^{-3}$ as shown in FIG. 5(B), a good eye pattern is not obtained, and the bit error rate deteriorates due to the occurrence of interference between codes.

As described above, this embodiment of the invention has the following effects.

(1) Since the white LED is multi-level-driven, the pulse height or the like can be digitally, favorably, and conveniently adjusted, and damage to the elements due to the flow of overcurrent that exceeds the current rating of the white LED, which may occur in the case of an analog-configured peaking circuit, can be prevented.

(2) In the case of a multi-level driving, the adjustment is facilitated as the minimum resolution of the pulse width becomes lower, but a clock that is the data clock times (the minimum pulse width of the transmission data/the minimum driving pulse width) is necessary. In contrast, in this embodiment, since the pulse widths WA and WC of the rising pulse SA and the falling pulse SC are set to be ½ of the minimum pulse width of the transmission data, the clock used to generate a multi-level driving current waveform merely is double the frequency of the transmission data clock, and thus the packaging is facilitated, and a cost advantage is secured.

(3) Since the receiving side does not use the blue color filter, the number of components is reduced, and a cost advantage is secured.

(4) Since the general-purpose multi-level driving LD driver IC, which is used in the optical media system, can be used, the system can be configured at low cost.

(5) By making the ratio Rab of the data pulse current value HB to the rising pulse current value HA and the ratio Rcb of the data pulse current value HB to the falling pulse current value HC equal to or lower than ⅓, the data transmission can be favorably performed.

Embodiment 2

Figure 6:
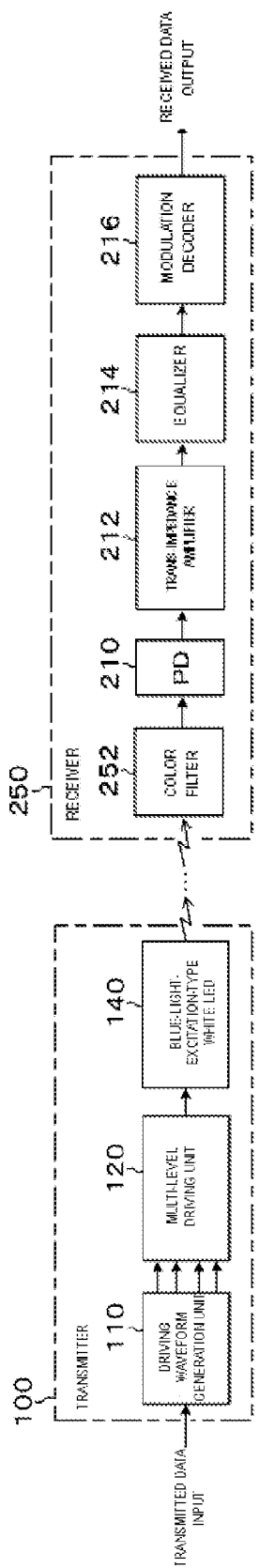
FIG. 6 is a circuit block diagram illustrating the configuration of a device according to Embodiment 2 of the invention.

Next, with reference to FIGS. 6 to 8(B), Embodiment 2 of the invention will be described. In this case, the same reference numerals are used for the constituent elements corresponding to those of Embodiment 1 of the invention as described above. FIG. 6 illustrates a circuit configuration according to Embodiment 2 of the present invention, which further includes a color filter 252 provided on the light incident side of the receiver 250. Other configurations are the same as Embodiment 1 described above. Accordingly, the signal waveforms as illustrated in FIG. 3 and the circuit configuration of FIG. 4 are the same as those of Embodiment 1 of the invention.

Figure 7:
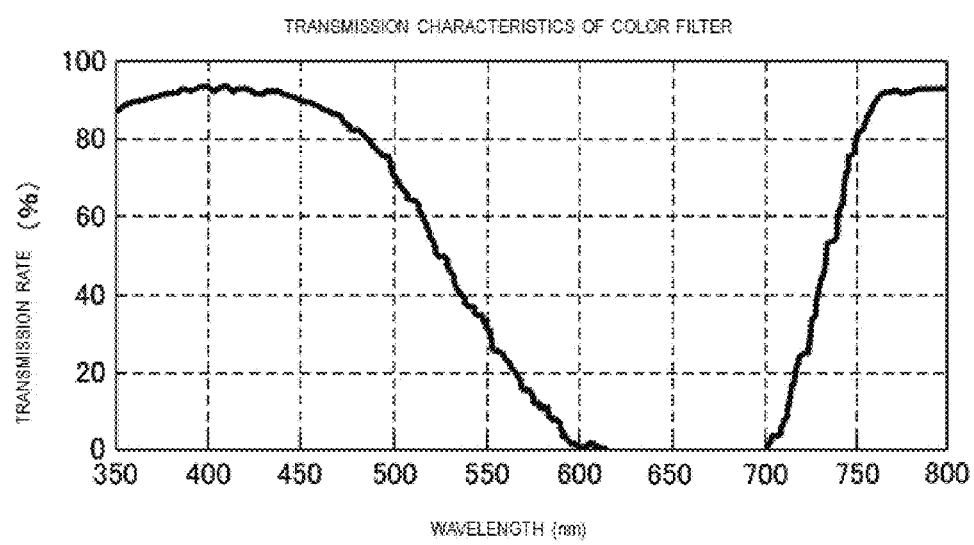
FIG. 7 is a graph illustrating an example of the transmission characteristics of a color filter according to the embodiment.
Figure 8:
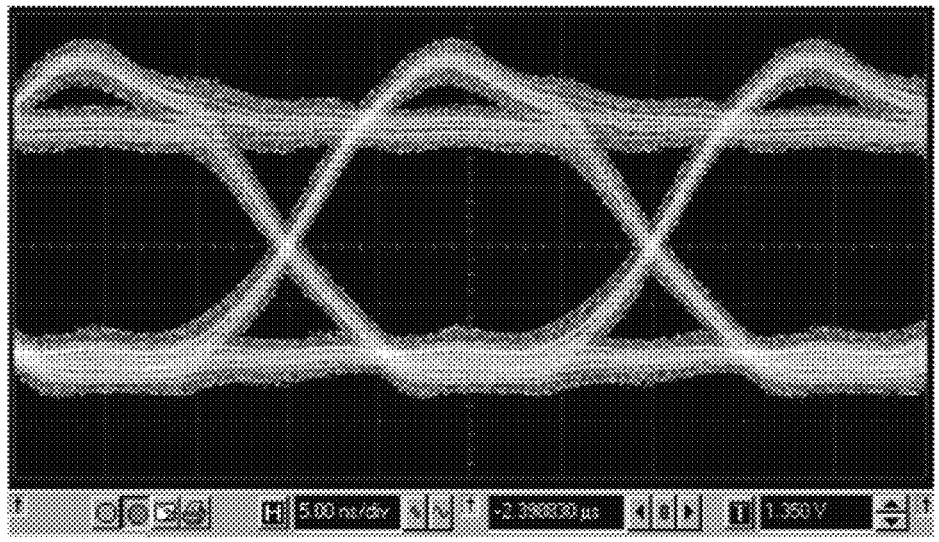
FIGS. 8(A) and 8(B) are graphs illustrating examples of an eye pattern according to the embodiment.
Figure 8:
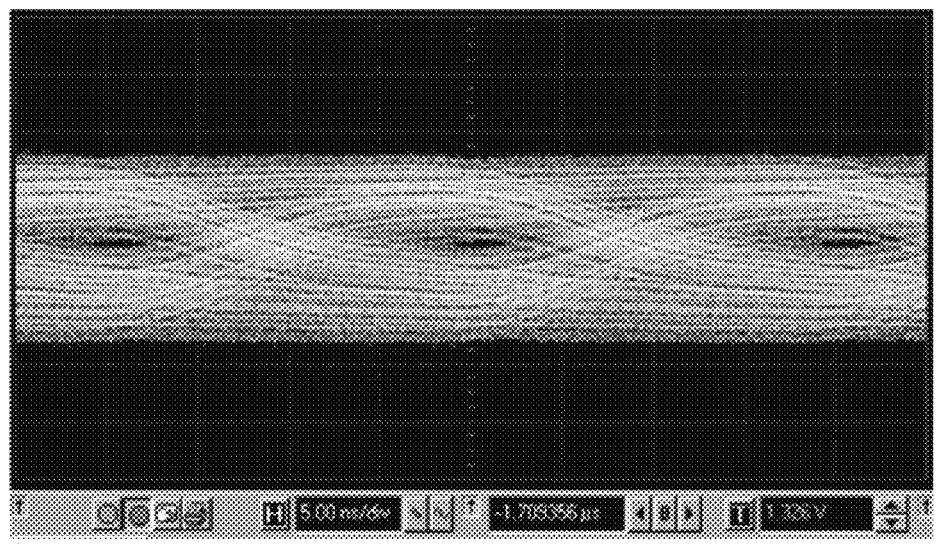

An example of light transmission characteristic of the color filter 252 is shown in FIG. 7. In the drawing, the horizontal axis represents the wavelength (nm), and the vertical axis represents the transmission rate (%). As shown in the drawing, the transmission rate of the light having a wavelength of around 500 nm to 750 nm is low. On the other hand, the emission spectrum of the blue-light-excitation-type white LED 140 of the transmitter 100 is shown in FIG. 2. Comparing them, it can be seen that the luminescence component from the phosphor that ranges from green in the vicinity of 550 nm to yellow is cut by the color filter 252.

Even in this embodiment, as for the pulse height (current level), the total sum of the respective pulses HA+HB+HC+HD is restricted by the condition of current rating of the LED of the object to be driven or the upper limit of the driving current value of the driving circuit. However, in this embodiment, in the case of realizing a transmission speed equal to or higher than 50 Mbps, the height of the data pulse SB is set to be equal to or lower than 5/4 of the height HA of the rising pulse SA and the height HC of the falling pulse SC. This way, the interference between codes is suppressed, and thus the bit error rate can be lowered.

In addition, in Embodiment 1, the blue-light-excitation-type white LED 140 is driven under conditions in Table 1. However, in Embodiment 2, the blue-light-excitation-type white LED 140 is driven under the setting conditions of the driving current shown in Table 3. For example, under the condition of "Setting 4" in Table 3, the following values are set.

(1) Current value HA of a rising pulse SA: 68.9 mA
(2) Current value HB of a data pulse SB: 12.4 mA
(3) Current value HC of a falling pulse SC: 64.3 mA
(4) Pre-bias current value HD: 5.2 mA

TABLE 3

| | Setting Values of Driving Current | | | | | | |
|---|---|---|---|---|---|---|---|
| | Setting 1 | Setting 2 | Setting 3 | Setting 4 | Setting 5 | Setting 6 | Setting 7 |
| Rising Pulse Current Value HA | 54.1 | 56.8 | 59.0 | 68.9 | 65.0 | 64.4 | 61.8 |
| Data Pulse Current Value HB | 0 | 4.3 | 9.5 | 12.4 | 18.6 | 22.4 | 27.3 |
| Falling Pulse Current Value HC | 56.3 | 56.3 | 57.2 | 64.3 | 60.0 | 60.6 | 58.2 |
| Pre-bias Current Value HD | | | | 5.2 | | | |
| The Ratio Rab of HB to HA | 0 | 0.07 | 0.16 | 0.18 | 0.29 | 0.35 | 0.44 |
| The Ratio Rcb of HB to HC | 0 | 0.08 | 0.17 | 0.19 | 0.31 | 0.37 | 0.47 |

| | Setting 8 | Setting 9 | Setting 10 | Setting 11 | Setting 12 | Setting 13 |
|---|---|---|---|---|---|---|
| Rising Pulse Current Value HA | 67.3 | 60.2 | 52.8 | 49.3 | 39.9 | 36.3 |
| Data Pulse Current Value HB | 33.6 | 45.2 | 55.9 | 60.5 | 82.2 | 101.2 |
| Falling Pulse Current Value HC | 68.6 | 65.2 | 65.8 | 61.5 | 50.3 | 40.2 |
| Pre-bias Current Value HD | | | | 5.2 | | |
| The Ratio Rab of HB to HA | 0.50 | 0.75 | 1.06 | 1.23 | 2.06 | 2.78 |
| The Ratio Rcb of HB to HC | 0.49 | 0.69 | 0.85 | 0.98 | 1.63 | 2.52 |

Unit of current values is all [mA]

Next, the operation of this embodiment as configured above will be described. The driving waveform generation unit 110 of the transmitter 100 receives an input of the transmission data as illustrated in FIG. 3(A), for example. Then, the driving waveform generation unit 110 and the multi-level driving unit 120 generate a multi-level driving signal as illustrated in FIG. 3(B) and provide it to the blue-light-excitation-type white LED 140, so that the white LED 140 emits light. The above-described operation is the same as that of Embodiment 1 described above.

The optical signal output from the blue-excitation type white LED 140 is incident on the color filter 252 of the receiver 250. Accordingly, most of the light output from the phosphor among the light output from the blue-excitation type white LED 140 is filtered. The light passing through the color filter 252 is condensed by a lens (not illustrated) or the like, and then is incident on the PD 210. The received optical signal is converted into a current signal through the PD 210, and then is converted into a voltage signal through the transimpedance amplifier 212. Also, the signal converted into the voltage is subjected to desired equalization through the equalizer 214, and then is binarized by the limiting amplifier 216 to obtain output data. In this embodiment of the present invention, a receiver is used in which the reception band of the modulated light of the receiver is sufficient for the transmission signal, and the frequency characteristic in the band necessary for the reception are flat.

Next, the experiments on data transmission and reception performed using a prototype visible light communication system of this embodiment will be described. The data transmission speeds were 4 kinds: 50 Mbps, 75 Mbps, 100 Mbps, and 125 Mbps, and the results of measuring the bit error rate under the respective driving setting conditions shown in Table 3 above are shown in Table 4 below. The transmission data was PRBS 27-1, and the number of transmission data was 1011 bits.

value HB to the falling pulse current value HC are set to 1.23 and 0.98, respectively. From this viewpoint, if the ratio Rab of the data pulse current value HB to the rising pulse current value HA, and the ratio Rcb of the data pulse current value HB to the falling pulse current value HC are at least equal to or smaller than $5/4$, the data transmission of 50 Mbps can be favorably performed.

Further, according to the results of Table 4, even in performing data transmission with a transmission speed equal to or higher than 75 Mbps, the driving current setting value in which there is no error or error rate value becomes sufficiently small is such that the ratio Rab of the data pulse current value HB to the rising pulse current value HA, and the ratio Rcb of the data pulse current value HB to the falling pulse current value HC are equal to or smaller than $5/4$.

Next, under the driving conditions of "Setting 7" and "Setting 13" of Table 4, an eye pattern during data transmission of 50 Mbps was measured. The results are as shown in FIGS. 8A and 8B. FIG. 8A shows an eye pattern under the driving condition of "Setting 7" that corresponds to error free, and FIG. 8B shows an eye pattern under the driving condition of "Setting 13" that corresponds to error occurrence. As shown in the drawings, in the case of the error free condition as shown in FIG. 8A, a good eye pattern is obtained. However, in the case where the bit error rate deteriorates to $3.8 \times 10^{-3}$ as shown in FIG. 8B, a good eye pattern is not obtained, and the bit error rate deteriorates due to the occurrence of interference between codes.

As described above, in this embodiment, although there is some degree of a deterioration in the quantity of light through the color filter, because the luminescence component by the phosphor in the emission spectrum of the blue-light-excitation-type white LED 140 is cut by the color filter 252, favorable data transmission can be performed even when the rising pulse or the falling pulse is lowered. Specifically, by making the ratio Rab of the data pulse current value HB to the rising

TABLE 4

| Bit Error Rate | | | | | | | |
|---|---|---|---|---|---|---|---|
| Transmission Speed | Setting 1 | Setting 2 | Setting 3 | Setting 4 | Setting 5 | Setting 6 | Setting 7 |
| 50 Mbps | $8.7 \times 10^{-5}$ | 0 | 0 | 0 | 0 | 0 | 0 |
| 75 Mbps | $1.8 \times 10^{-4}$ | 0 | 0 | 0 | 0 | 0 | 0 |
| 100 Mbps | $1.2 \times 10^{-4}$ | 0 | 0 | 0 | $1.0 \times 10^{-11}$ | $3.0 \times 10^{-11}$ | $5.0 \times 10^{-11}$ |
| 125 Mbps | $5.8 \times 10^{-4}$ | 0 | 0 | 0 | $8.5 \times 10^{-7}$ | $3.4 \times 10^{-4}$ | $1.2 \times 10^{-2}$ |

| Transmission Speed | Setting 8 | Setting 9 | Setting 10 | Setting 11 | Setting 12 | Setting 13 |
|---|---|---|---|---|---|---|
| 50 Mbps | 0 | 0 | 0 | $1.0 \times 10^{-11}$ | $2.2 \times 10^{-6}$ | $3.8 \times 10^{-2}$ |
| 75 Mbps | $2.7 \times 10^{-7}$ | $1.5 \times 10^{-4}$ | $7.8 \times 10^{-4}$ | $6.9 \times 10^{-3}$ | NoSync | NoSync |
| 100 Mbps | $7.0 \times 10^{-3}$ | $3.2 \times 10^{-2}$ | $3.9 \times 10^{-2}$ | NoSync | NoSync | NoSync |
| 125 Mbps | $4.4 \times 10^{-2}$ | NoSync | NoSync | NoSync | NoSync | NoSync |

"NoSync" indicates a non-synchronous state.

For example, in Table 4, when the uppermost transmission speed was 50 Mbps, there was no error or error rate value was sufficiently low under the conditions of "Setting 1" through "Setting 11", and thus data can be transmitted with no practical problem. Also, for the conditions of "Setting 2" to "Setting 10", as shown in Table 3, the ratio Rab (=HB/HA) of a data pulse current value HB to a rising pulse current value HA, and the ratio Rcb (HB/HC) of the data pulse current value HB to a falling pulse current value HC are all equal to or smaller than $5/4$. Also, for the condition of "Setting 11", the ratio Rab of the data pulse current value HB to the rising pulse current value HA, and the ratio Rcb of the data pulse current pulse current value HA and the ratio Rcb of the data pulse current value HB to the falling pulse current value HC equal to or smaller than $5/4$, the data transmission can be favorably performed.

Embodiment 3

Figure 9:
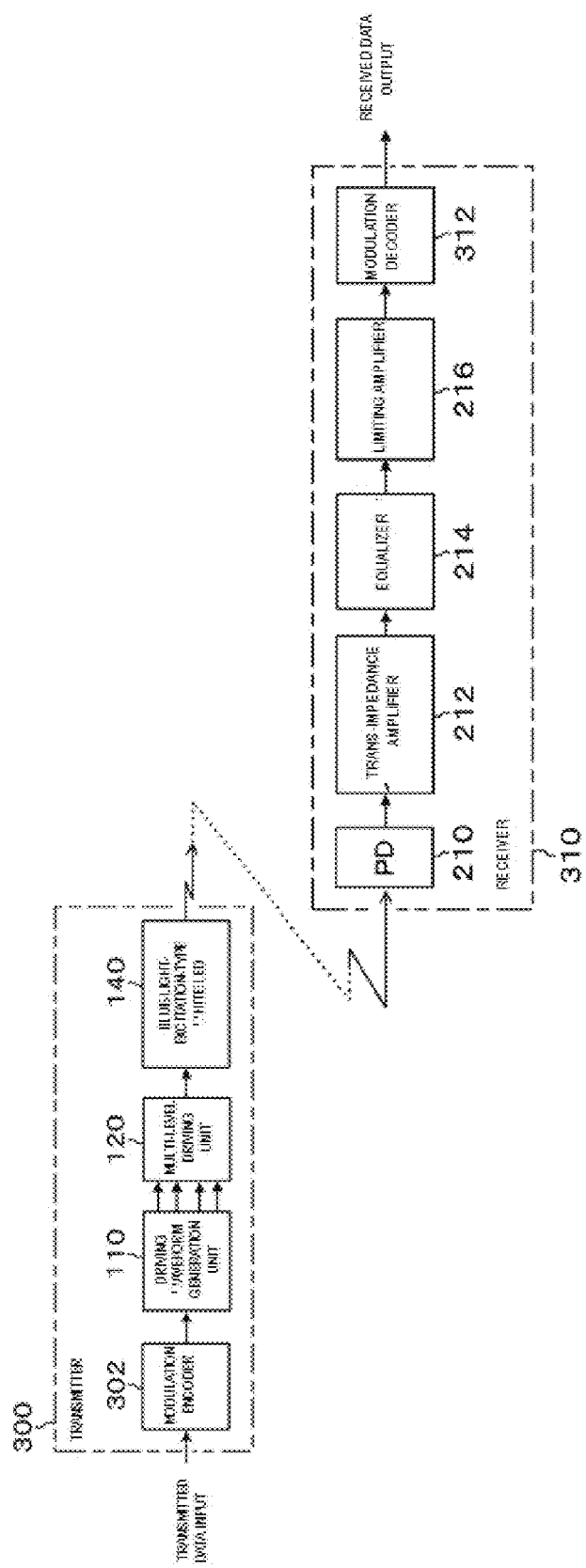
FIG. 9 is a circuit block diagram illustrating the configuration of a device according to Embodiment 3 of the invention.

Next, with reference to FIGS. 9 and 10(B), Embodiment 3 of the present invention will be described. FIG. 9 illustrates a circuit configuration according to the present embodiment of the invention. With respect to the circuit configuration of Embodiment 1 as illustrated in FIG. 1, the circuit configuration of Embodiment 3 further includes a modulation encoder 302 provided on the input side of the driving waveform generation unit 110 in the transmitter 300 and a modulation decoder 312 provided on the output side of the limiting amplifier 216 in the receiver 310.

Examples of modulation codes used as the modulation encoder 302 may be (1) NRZ (Non Return to Zero) code
(2) Manchester code (for example, see JP-A-7-183849)
(3) 8B10B (For example, see U.S. Pat. No. 4,486,739)
(4) 17PP (For example, see Japanese Patent No. 3985173)

In Table 5, relationships between the modulation codes and the corresponding numerals are indicated. In this case, the modulation band upper limit frequency value is calculated as (1/minimum pulse width)×0.7 from general experimental rules.

TABLE 5

Modulation Codes and Corresponding Numerals

| Modulation Code | DC Free | Minimum Pulse Width (ns) | Modulation Band Upper Limit Frequency (MHz) | Bit Rate after Encoding (Mbps) |
| --- | --- | --- | --- | --- |
| NRZ | X | 10 | 70 | 100 |
| Manchester | ○ | 5 | 140 | 200 |
| 8B10B | ○ | 8 | 87.5 | 125 |
| 17PP | ○ | 13.3 | 52.5 | 150 |

The transmission speed is set to 100 Mbps.

In this embodiment, 8B10B and 17PP are used as the modulation codes in the modulation encoder 302. The reasons why these codes are used are as follows.

(1) All the modulation codes are DC free codes. Accordingly, the clock reproduction is facilitated on the receiving side, and an unnecessary flicking that may cause a problem when visible light is used as a carrier can be suppressed. Further, since the DC component can be removed on the receiving circuit, the influence of ambient light (sunlight) which has not been modulated can be suppressed.

(2) For example, as compared with the Manchester code, as shown in Table 5, the width of the minimum pulse that is necessary for the transmission speed is larger. Accordingly, the necessary modulation band upper limit frequency can be lowered.

The modulation code 8B10B is a coding method that transforms 8-bit data into 10-bit data. Since a logic value of "1" or "0" of more than 5 bits does not continue, it is possible to extract the clock from the data, and the data and the clock can be transmitted on the same line. On the other hand, the modulation code 17PP is a code that is generally classified as a (1,7) RLL code. RLL (Run Length Limited) code is a code that is obtained by limiting only one or both of the minimum value (minimum run) and the maximum value (maximum run) of the number of logic values "0" that enter between logic values "1" and "1" in a code series before NRZI (NonReturn to Zero Inverted) modulation, which inverts a transmission square wave in bit 1, is performed. If it is assumed that the minimum run is d and the maximum run is k, the NRZI modulation is expressed as "(d,k)RLL". For example, if the expression is (1,7)RLL, the number of continuous logic values "0" or "1" is 2 (minimum) to 8 (maximum). In this case, the encoding rate of 17PP, which is the value of m/n where the length of data bits before the encoding is m and the length of data bits after the encoding is n, is ⅔.

Figure 10:
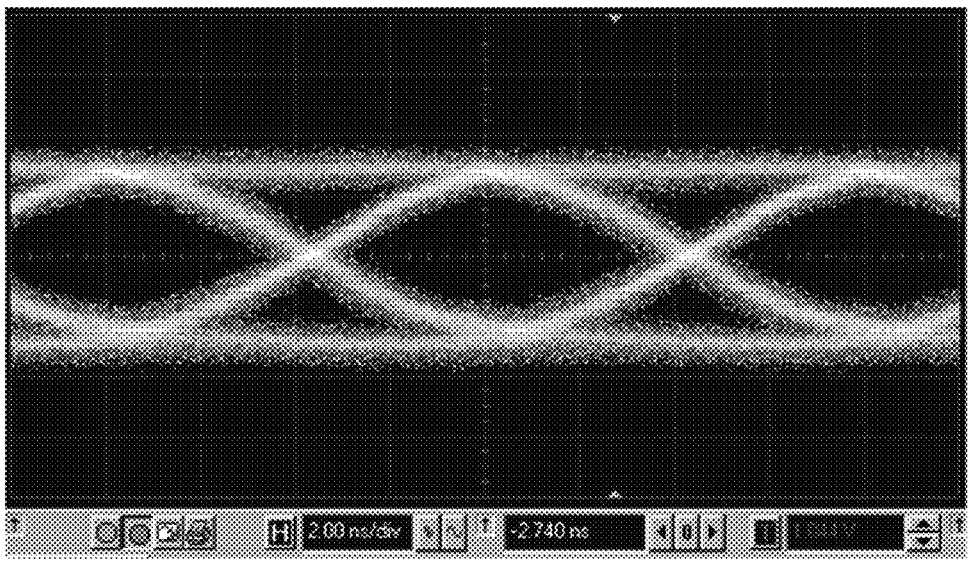
FIGS. 10(A) and 10(B) are graphs illustrating examples of an eye pattern according to the embodiment.
Figure 10:
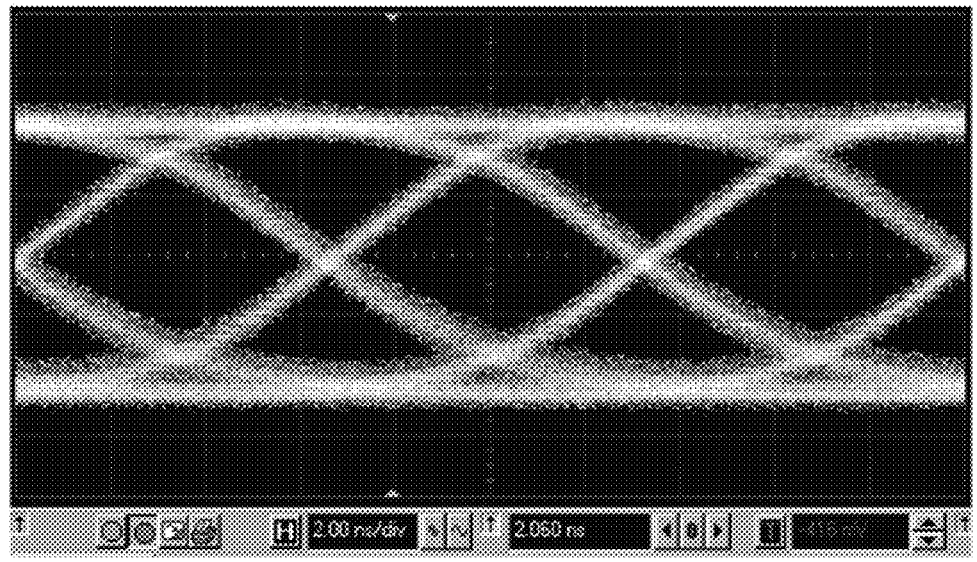

For the receiver 310 which uses the modulation codes of 8B10B and 17PP as described above, the eye patterns of the output of the limiting amplifier 216 at a data transmission speed of 100 Mbps are shown in FIGS. 10(A) and 10(B). In the case of the modulation code of 8B10B, the driving condition was "Setting 3" in Table 1, and in the case of the modulation code of 17PP, the driving condition was "Setting 4". As shown in FIGS. 10(A) and 10(B), a good eye pattern which corresponds to being error free was obtained for both modulation codes. In the case of being error free, it is needless to say that the driving condition as indicated in Embodiment 1 is satisfied.

As described above, in this embodiment, by using the modulation codes of DC free, the following effects can be obtained.

(1) An unnecessary flickering which may cause a problem when visible light is used as a carrier can be suppressed.

(2) Since the DC component can be removed on the reception circuit, the influence of ambient light (sunlight) which has not been modulated can be suppressed.

Embodiment 4

Figure 11:
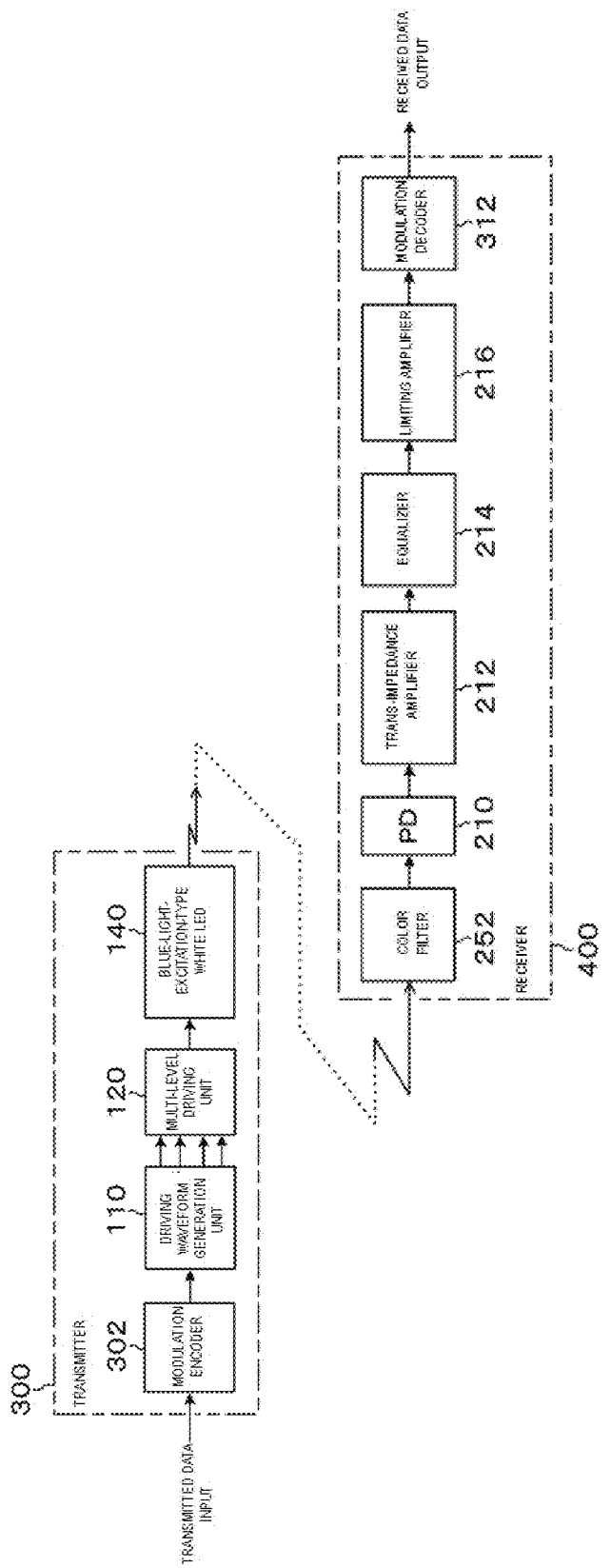
FIG. 11 is a circuit block diagram illustrating the configuration of a device according to Embodiment 4 of the invention.
Figure 12:
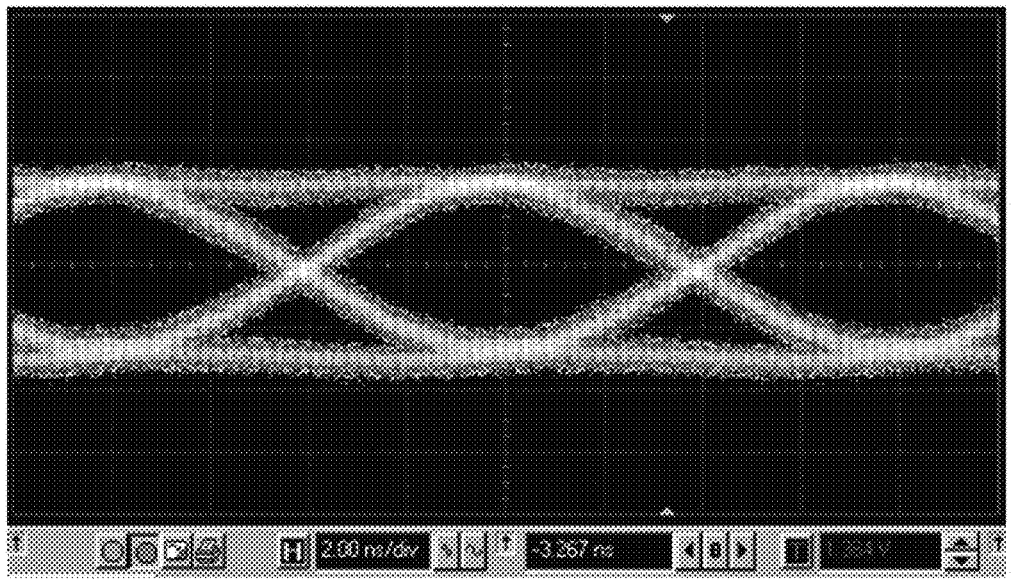
FIGS. 12(A) and 12(B) are graphs illustrating examples of an eye pattern according to the embodiment.
Figure 12:
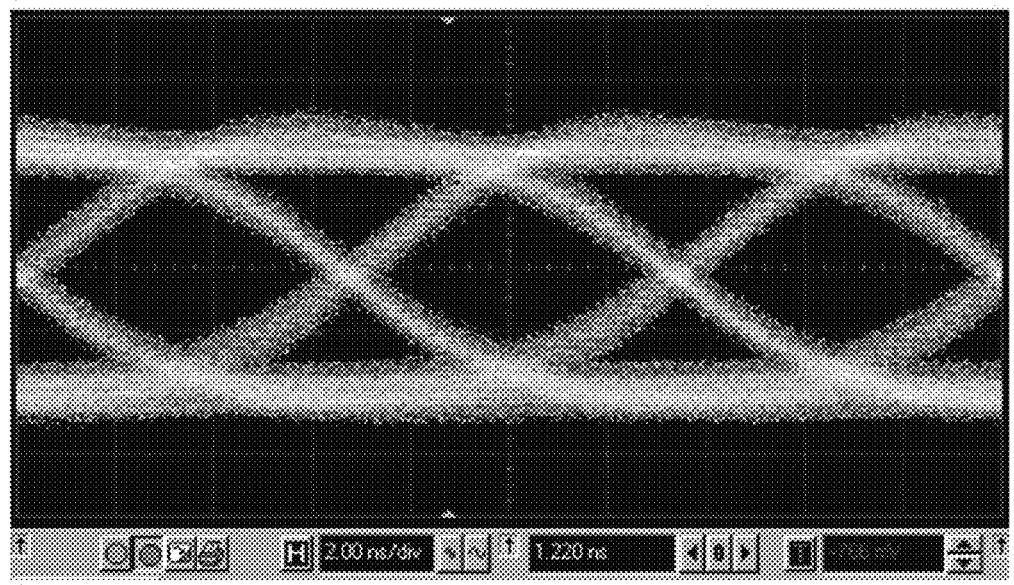
Figure 13:
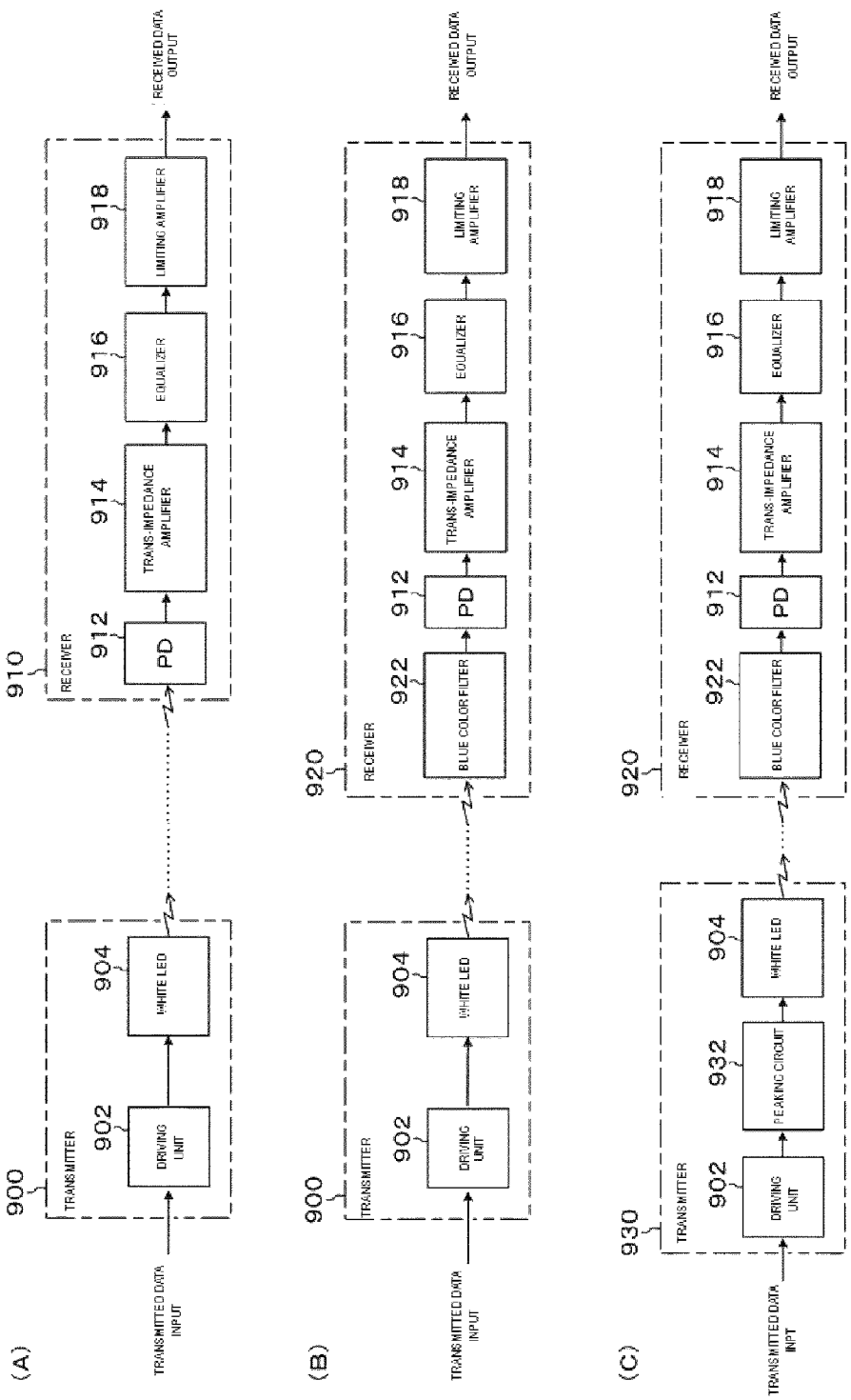
FIGS. 13(A) to 13(C) are circuit block diagrams illustrating the configuration of visible light communication systems in the related art.

Next, with reference to FIGS. 11 to 12B, Embodiment 4 of the present invention will be described. This embodiment is obtained by applying Embodiment 3 described above illustrated in FIG. 9 to Embodiment 2 described above illustrated in FIG. 6. The transmitter 300 has the same configuration as that of Embodiment 3. In the receiver 400, the color filter 252 is installed on the light incident side, and a modulation decoder 312 is additionally installed on the output side of the limiting amplifier 216.

In the same manner, the data transmission speed was set to 100 Mbps, and the modulation codes 8B10B and 17PP were used. The eye patterns of the output of the limiting amplifier 216 are shown in FIGS. 12(A) and 12(B). In the case of 8B10B, the driving condition is set to "Setting 5" in Table 3, and in the case of 17PP, the driving condition is set to "Setting 6". Whichever modulation codes is used, a good eye pattern is obtained, which corresponds to error free. In the case of the error free condition, it is needless to say that the driving condition as indicated in the Embodiment 2 is satisfied. In this embodiment, the same effects as those of the Embodiment 3 as described above can be obtained.

The present invention is not limited to the embodiments as described above, and diverse modifications may be made without departing from the scope of the invention. For example, the present invention may also include the following.

(1) As the blue-light-excitation-type white LED 140, it is common that the phosphor excited by the light output from the blue LED emits yellow light that is complementary to the blue. However, recently, there is an LED which has phosphor luminescence components including a red color component, and such an LED is included in the blue-light-excitation-type white LED.

(2) In the above-described embodiments, the circuit configuration of the driving waveform generation unit 110 and the multi-level driving unit 120 is exemplary, and various kinds of known circuit configurations having the same operations may be adopted.

INDUSTRIAL APPLICABILITY

According to the present invention, visible light data communications can be performed at a sufficient transmission speed using the blue-light-excitation-type white LED, and thus the present invention is suitable to a high-speed visible light communication.

The invention claimed is:

1. A visible light communication transmitter that drives a blue-light-excitation-type white LED based on a driving current signal generated in accordance with transmission data and outputs a visible light signal to a receiver, comprising:
a multi-level driving unit that generates a multi-level driving current signal by adding a rising pulse when the transmission data rises and adding a falling pulse when the transmission data falls,
wherein a pulse width of the rising pulse and the falling pulse is ½ of a minimum pulse width of the transmission data.

2. A visible light communication system, comprising:
the visible light communication transmitter according to claim 1; and
a visible light communication receiver that receives the visible light signal output from the visible light communication transmitter, converts the received optical signal into an electric signal, and outputs received data.

3. A visible light communication system, comprising:
a visible light communication transmitter that drives a blue-light-excitation-type white LED based on a driving current signal generated in accordance with transmission data and outputs a visible light signal to a receiver, said visible light communication transmitter including a multi-level driving unit that generates a multi-level driving current signal by adding a rising pulse when the transmission data rises and adding a falling pulse when the transmission data falls; and
a visible light communication receiver that receives the visible light signal output from the visible light communication transmitter, converts the received optical signal into an electric signal, and outputs received data,
wherein a driving current value corresponding to the transmission data is equal to or smaller than ⅓ of a current value of at least one of the rising pulse and the falling pulse.

4. A visible light communication system, comprising:
a visible light communication transmitter that drives a blue-light-excitation-type white LED based on a driving current signal generated in accordance with transmission data and outputs a visible light signal to a receiver, said visible light communication transmitter including a multi-level driving unit that generates a multi-level driving current signal by adding a rising pulse when the transmission data rises and adding a falling pulse when the transmission data falls; and
a visible light communication receiver that receives the visible light signal output from the visible light communication transmitter through a color filter that removes at least a portion of light output from a phosphor of the blue-light-excitation-type white LED, converts the received optical signal into an electric signal, and outputs received data,
wherein a driving current value corresponding to the transmission data is equal to or smaller than ⅘ of a current value of the rising pulse and the falling pulse.

5. The visible light communication system according to any one of claims 2, 3, or 4, wherein a modulation encoder is installed in the visible light communication transmitter, and a modulation decoder that decodes a modulation code modulated in the modulation encoder is installed in the visible light communication receiver.

6. A visible light communication system, comprising:
a visible light communication transmitter that drives a blue-light-excitation-type white LED based on a driving current signal generated in accordance with transmission data and outputs a visible light signal to a receiver, said visible light communication transmitter including a multi-level driving unit that generates a multi-level driving current signal by adding a rising pulse when the transmission data rises and adding a falling pulse when the transmission data falls; and
a visible light communication receiver that receives the visible light signal output from the visible light communication transmitter, converts the received optical signal into an electric signal, and outputs received data,
wherein a modulation encoder is installed in the visible light communication transmitter, and a modulation decoder that decodes a modulation code modulated in the modulation encoder is installed in the visible light communication receiver, and
wherein a run length limited code, which is DC free, of which an encoding rate is ⅔, and of which a minimum run is 1, is used as the modulation code, and NRZI modulation is performed.

* * * * *